United States Patent
Estrada et al.

(10) Patent No.: US 12,105,417 B2
(45) Date of Patent: Oct. 1, 2024

(54) METHOD OF FORMING A PHOTO-CURED LAYER

(71) Applicant: CANON KABUSHIKI KAISHA, Tokyo (JP)

(72) Inventors: Teresa Perez Estrada, Pflugerville, TX (US); Timothy Brian Stachowiak, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 379 days.

(21) Appl. No.: 17/450,009

(22) Filed: Oct. 5, 2021

(65) Prior Publication Data

US 2023/0103545 A1    Apr. 6, 2023

(51) Int. Cl.
G03F 7/00 (2006.01)
C08F 20/16 (2006.01)
C08F 20/30 (2006.01)
C08F 20/68 (2006.01)

(52) U.S. Cl.
CPC ............ *G03F 7/0002* (2013.01); *C08F 20/16* (2013.01); *C08F 20/30* (2013.01); *C08F 20/68* (2013.01)

(58) Field of Classification Search
CPC ........ G03F 7/0002; C08F 20/16; C08F 20/30; C08F 220/1806
See application file for complete search history.

(56) References Cited

U.S. PATENT DOCUMENTS

| 8,545,709 B2 | 10/2013 | Brooks |
| 10,871,710 B2 | 12/2020 | Sakata |
| 2005/0160011 A1 | 7/2005 | Sreenivasan |
| 2006/0019375 A1 | 1/2006 | Seidl |
| 2006/0196375 A1 | 9/2006 | Coe-Sullivan |
| 2010/0330807 A1 | 12/2010 | Kobayashi |
| 2012/0129279 A1 | 5/2012 | Matsuoka |
| 2013/0200498 A1 | 8/2013 | Mangan |
| 2019/0377260 A1* | 12/2019 | Otani .................... G03F 7/0002 |

(Continued)

FOREIGN PATENT DOCUMENTS

| JP | 2012114158 A | 6/2012 |
| JP | 2015167203 A1 | 9/2015 |

(Continued)

OTHER PUBLICATIONS

Pollara, Luigi "Surface Tension and Vapor Pressure". Phys. Chem. 1942, 46, 9, pp. 1163-1167 (Year: 1942).*

(Continued)

*Primary Examiner* — Binh X Tran
(74) *Attorney, Agent, or Firm* — Abel Schillinger, LLP

(57) ABSTRACT

A method of forming a photo-cured layer on a substrate can include applying a first photocurable composition overlying a first region of the substrate and a second photocurable composition overlying a second region of the substrate and photo-curing the applied compositions, wherein the first region is a center region of the substrate and the second region is an edge region of the substrate, and the second photocurable composition has a higher vapor pressure than the first photocurable composition. The method can have the advantage that the forming of an extrusion within the edge region of the photo-cured layer can be avoided or being kept very low.

21 Claims, 3 Drawing Sheets

(56) References Cited

U.S. PATENT DOCUMENTS

2020/0292934 A1  9/2020  Simpson
2021/0072640 A1  3/2021  Higuchi

FOREIGN PATENT DOCUMENTS

JP  5806501 B2  11/2015
JP  2017162923 A  9/2017
WO  2005120834 A  7/2013

OTHER PUBLICATIONS

Thomas et al. "Multifunctional Structure-Power for Electric Unmanned Systems", pp. 1-18 (Year: 2006).*
Wikipedia Simple English, "Room temperature" via https://simple.wikipedia.org/wiki/Room_temperature ; p. 1 (Year: 2024).*

* cited by examiner

METHOD OF FORMING A PHOTO-CURED LAYER

FIELD OF THE DISCLOSURE

The present disclosure relates to a method of forming a photo-cured layer on a substrate, particularly to a method of forming a photo-cured layer having a very low or no extrusion within the edge region.

BACKGROUND

In drop-on-demand imprint lithography, speeding up drop spreading of the photocurable material (e.g., resist) before an imprint template touches the drops is desired to increase the throughput of an imprint process, Accelerated resist spreading on the surface of a substrate can be challenging, however. For example, a resist material being designed to fill wafer features at a fast spreading time may often lead to excess fluid at the edge regions of the wafer that can cause the forming of unwanted defects called 'extrusions' after curing.

There exists a need for improving the balance between fast resist filling and extrusion control at the edge regions in imprint and other processing.

SUMMARY

In one embodiment, a method of forming a photo-cured layer on a substrate can comprise: applying a first photocurable composition overlying a first region of the substrate and a second photocurable composition overlying a second region of the substrate; contacting the first photocurable composition and the second photocurable composition with a template or superstrate; photo-curing the first photocurable composition and the second photocurable composition; and removing the template or superstrate, wherein the first region is a center region of the substrate and the second region is an edge region of the substrate, and the second photocurable composition has a higher vapor pressure than the first photocurable composition.

In one aspect of the method, the vapor pressure of the second photocurable composition can be at least two times greater than the vapor pressure of the first photocurable composition.

In another aspect, the vapor pressure of the second photocurable composition can have a vapor pressure of at least 0.01 mm Hg.

In a further aspect of the method, the first photocurable composition can comprise a first polymerizable material and a first photoinitiator, and the second photocurable composition can comprise a second polymerizable material and a second photoinitiator.

In a particular aspect, the first polymerizable material can comprise at least one different monomer than the second polymerizable material.

In a certain particular aspect, the first photocurable composition can be essentially free of a solvent and the second photocurable composition can be essentially free of a solvent.

In one embodiment of the method, the first polymerizable material can comprise at least one first acrylate monomer, and the second polymerizable material may comprise at least one second acrylate monomer, the at least one first acrylate monomer being different than the at least one second acrylate monomer.

In a further embodiment of the method, the second region of the substrate may extend not more than 5 mm from an outer end of the substrate towards a center point of the substrate. In a certain aspect, the second region can extend not more than 1 mm from the outer end of the substrate towards a center point of the substrate. In yet another aspect, the second region can extend not more than 0.5 mm from the outer end of the substrate towards a center point of the substrate.

In another embodiment of the method, an area ratio of the first region of the substrate to the second region of the substrate can be at least 10:1. In a particular aspect, the area ratio of the first region of the substrate to the second region of the substrate can be at least 25:1.

In one aspect of the method, the first photocurable composition can be applied with a first dispenser on the substrate and the second photocurable composition can be applied with a second dispenser on the substrate. In a particular aspect, the first photocurable composition may be applied during a same time period as the second photocurable composition on the substrate.

In one embodiment of the method, a maximum height of an extrusion of the formed photo-cured layer within the second region may be not greater than a maximum feature height of the pattern.

In a certain aspect of the method, the maximum height of an extrusion of the photo-cured layer within the second region can be not greater than 60 nm.

In another embodiment of the method, a first etch rate of the photo-cured layer within the first region can differ not more by 10% from a second etch rate of the photo-cured layer within the second region.

In one aspect, the method can be adapted for nanoimprint lithography or inkjet adaptive planarization, and the first photocurable composition can be a first imprint resist and the second photocurable composition may be a second imprint resist.

In one embodiment, a method of forming an article can comprise: applying a first photocurable composition to a first region of a substrate and a second photocurable composition to a second region of the substrate, wherein the first region is a center region of the substrate and the second region is an edge region of the substrate, and the second photocurable composition can have a higher vapor pressure than the first photocurable composition; contacting the first photocurable composition and the second photocurable composition with a template or superstrate; photo-curing the first photocurable composition and the second photocurable composition to obtain a photo-cured layer; removing the template or superstrate from the photo-cured layer, and processing the substrate with the photo-cured layer to make the article.

In one aspect of the method of forming an article, an area ratio of the first region to the second region can be at least 10:1, and the second photocurable composition may have a two times greater vapor pressure than the first photocurable composition.

BRIEF DESCRIPTION OF THE DRAWINGS

Embodiments are illustrated by way of example and are not limited in the accompanying figure.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description is provided to assist in understanding the teachings disclosed herein and will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Figure 1:
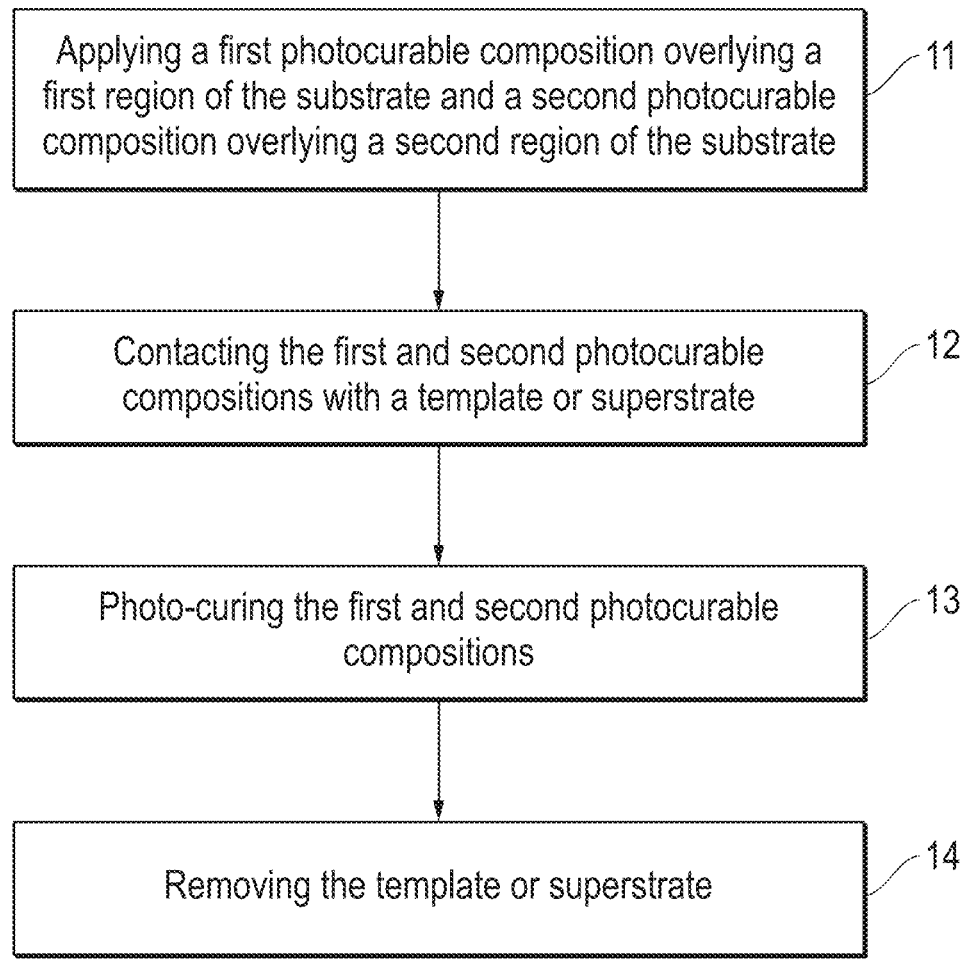
FIG. 1 includes a scheme describing a method of forming a cured layer according to one embodiment.

The present disclosure is directed to a method of forming a photo-cured layer on a substrate. In one embodiment, as also illustrated in FIG. 1, the method can comprise the following steps: 11) applying a first photocurable composition overlying a first region of the substrate and a second photocurable composition overlying a second region of the substrate; 12) contacting the first and second photocurable compositions with a template or superstrate; 13) photo-curing the first and second photocurable compositions; and 14) removing the template or superstrate. The method can comprise applying a first photocurable composition within a center region of the substrate (herein also called "first region") and a second photocurable composition within an edge region of the substrate (herein also called "second region"), wherein the second photocurable composition has a higher vapor pressure than the first photocurable composition. The method can be adapted for use in step-and-repeat imprint lithography or whole wafer imprint or planarization processes, and may have the advantage of a fast resist drop spreading within the center region of the substrate, and the avoidance or minimizing of the formation of an extrusion within the edge region of the substrate.

Figure 2A:
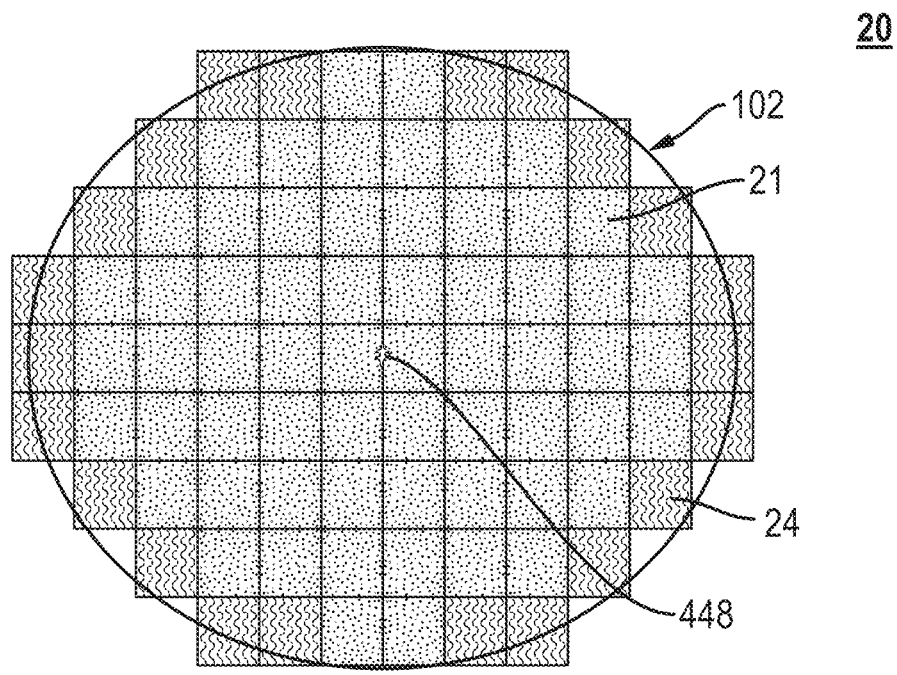
FIG. 2A illustrates a top view of a wafer containing an array of rectangular shaped fields for step and repeat imprinting according to one embodiment.

FIG. 2A illustrates a line drawing of an array of rectangular shaped fields for step and repeat imprinting across a semiconductor wafer substrate. A single substrate may be used to produce a large plurality of identical devices. A step and repeat process can typically involve that the substrate be divided into a plurality of fields (20). Each field (21) may include one or many identical devices. The circular substrate shown in FIG. 2A is divided into 84 representative rectangular fields including a plurality of full fields (21) and a plurality of partial fields (24) at the corner region of the wafer. The center of the wafer is indicated by number 448.

Figure 2B:
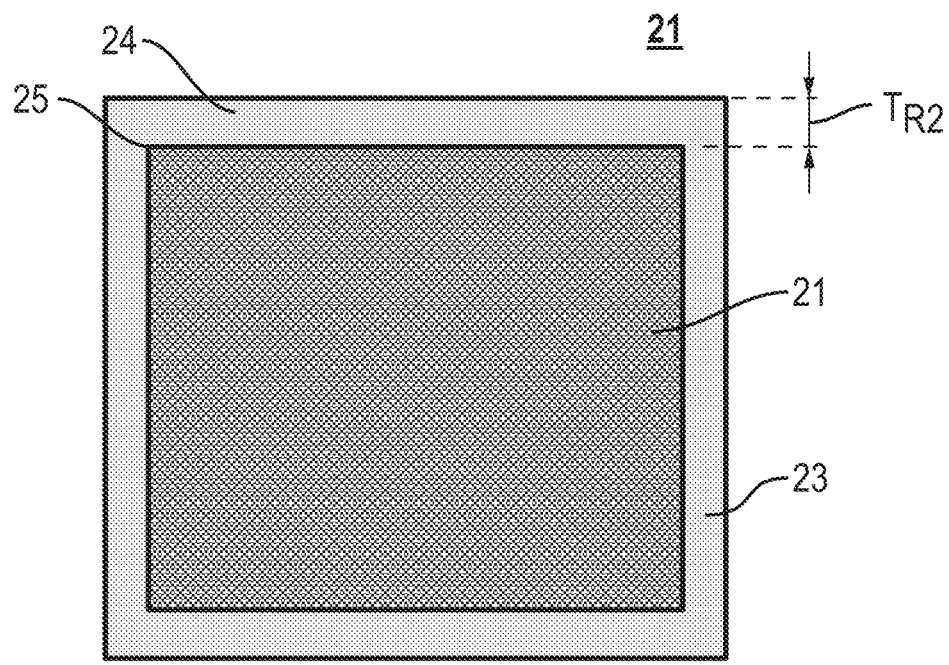
FIG. 2B illustrates a top view of one rectangular field of the array shown in FIG. 2A, including a first region and a second region according to one embodiment.

FIG. 2B shows one single rectangular full field of the array of FIG. 2A. As used herein, the term "field" is interchangeable used with the term "substrate" or "substrate field" unless indicated otherwise. The substrate field (21) shown in FIG. 2B includes a first region (22) for applying the first photocurable composition and a second region (23) for placing the second photocurable composition. In one aspect, the first photocurable composition can be applied with a first dispenser by selectively dispersing the composition within the first region (22) of the substrate, and the second photocurable composition may be applied with a second dispenser overlying the second region (23) of the substrate. In a particular aspect, both the first and the second photocurable compositions can be applied concurrently to the corresponding regions during a same time period on the substrate. The thickness $T_{R2}$ of the second region can be uniform or non-uniform throughout the edge region of the substrate.

In one aspect, an area ratio of the first region (22) to the second region (23) can be at least 10:1, or at least 15:1, or at least 20:1, or at least 25:1, or at least 28:1, or at least 30:1.

In a further aspect, the thickness of the second region ($T_{R2}$) can extend not more than 5 mm in orthogonal direction from an outer end (24) of the substrate (21) until the outer end (25) of the first region of the substrate, such as not more than 2.5 mm, not more than 1 mm, or not more than 0.5 mm.

Figure 2C:
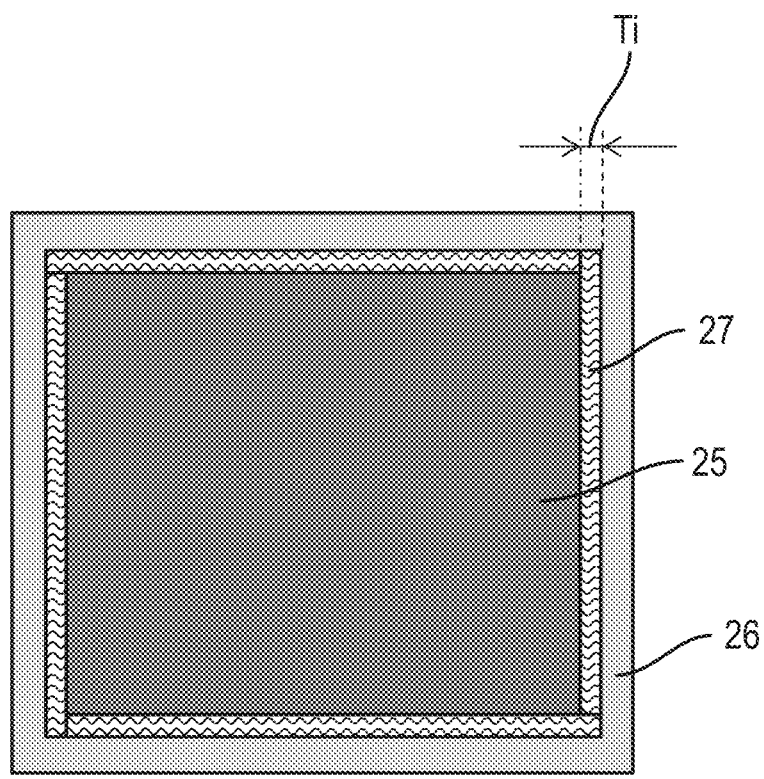
FIG. 2C illustrates a top view of the substrate shown in FIG. 2A, further containing a first photocurable composition and a second photocurable composition overlying the substrate and an interference region between the first and second photocurable compositions according to one embodiment.

The first photocurable composition and the second photocurable composition can be fully miscible with each other. In one aspect, during the step (12) of contacting the superstrate or template with the dispersed first photocurable composition and the dispersed second photocurable compositions, the first photocurable composition (25) and the second photocurable composition (26) overlying the substrate may merge and intermix at an interface region (27) between the first region covered with the first photocurable composition (25) and second region covered with the second photocurable composition (26), see illustration shown in FIG. 2C. The interface region (27) can be controlled by regulating the drop size and drop quantity within each region, such that the interface region may only contribute to not greater than 20% of the area of the edge region, or not greater than 10%, or not greater than 5%, or not greater than 2%. As used herein, the interference region (27) is a region wherein material of both the first photocurable composition and the second photocurable composition can be detected. In a certain particular aspect, the interface region (27) can have a thickness Ti of not greater than 500 microns, or not greater than 300 microns, or not greater than 200 microns, or not greater than 100 microns.

In one embodiment, the step of the photo-curing (13) may be conducted with UV light having a wavelength range between 300 nm and 430 nm.

The photocurable compositions used in the method of the present disclosure can be adapted that the first photocurable composition may be photo-cured with a weight loss of not more than 10 wt % based on the total weight of the photocurable composition, while the weight loss of the second photocurable composition after the photo-curing can be greater than 10 wt %. In particular aspects, the weight loss of the second photocurable composition can be at least 15 wt % based on the total weight of the applied photocurable composition, or at least 20 wt %, or at least 25 wt %, or at least 30 wt %, or at least 40 wt %, or at less 50 wt %. The weight loss of the second photocurable composition can be at least in part related to the high vapor pressure of the second photocurable composition, such that even before the superstrate or template contact the second photocurable composition, a high percentage of the second photocurable composition may be already evaporated.

The evaporation of a large percentage of the applied second photocurable composition can have the advantage that the forming of an extrusion within the edge region of the photo-cured layer may be avoided or be very limited. As used herein, the term extrusion relates to an unwanted elevation of the photo-cured layer. In one aspect, an extrusion of the photo-cured layer formed within the edge region of the wafer can have a height of not greater than the feature height in orthogonal directions from an average plain surface of the photo-cured layer. As used herein, the term "feature height" addresses the maximum height of a pattern formed on the substrate. In certain aspects, the extrusion height can be not greater than 100 nm, or not greater than 80 nm, or not greater than 60 nm. In a particular embodiment, the photo-cured layer can be free of an extrusion. As used herein, the term "free of an extrusion" means having no elevation of the photo-cured layer within the second region greater than 50 nm.

In another embodiment, the first photocurable composition and the second photocurable composition can be adapted that after photo-curing, the etch resistance of the photo-cured layer within the center (first) region can differ not more by 10 percent from the edge resistance within the edge (second) region of the photo-cured layer. As used herein, etch resistance applies to all standard etching procedure used during imprint processing, for example $O_2/Ar$, $Cl_2/O_2$, or $CF_4/Ar$ etching.

In one embodiment, the substrate can be a wafer. Non-limiting materials of the substrate can be silicon, fused silica, quartz, silicon germanium, gallium arsenide, indium phosphide, silicon carbide, or silicon nitride.

In a particular embodiment, the substrate can include an adhesion layer overlying an exterior surface of the substrate, and the first and second photocurable compositions can be directly applied on the adhesion layer. As used herein, the term substrate is intended to mean both options, a substrate without an adhesion layer or a substrate including an adhesion layer, unless indicated otherwise.

In one embodiment, the first photocurable composition can comprise a first polymerizable material and a first photoinitiator, and the second photocurable composition can comprise a second polymerizable material and a second photoinitiator. In one aspect, the first polymerizable material can differ from the second polymerizable material by the additional presence or absence of at least one polymerizable monomer.

In aspects, the first photoinitiator of the first photocurable composition and the second photoinitiator of the second photocurable composition can be different or the same.

In one aspect, the first photocurable composition can be any photocurable composition suitable for imprint or other wafer processing which may be applied in a defined manner over a first surface region of a substrate. The polymerizable material can include polymerizable monomers, oligomers, or polymers. In certain aspects, the polymerizable material can include multi-functional monomers or oligomers, also called herein crosslinker. In a particular aspect, the polymerizable material can include mono-functional and or multifunctional acrylate monomers. Specific non-limiting examples of suitable monomers can be monomers described, for example, in US 2018/0272634, which is expressly incorporated by reference herein.

In one aspect, the vapor pressure of the second photocurable composition can be at least two times greater hat the vapor pressure of the first photocurable composition, such as least at least 5 times greater, at least 10 times greater, at least 20 times greater, at least 30 times greater, at least 40 times greater, at least 50 times greater, at least 60 times greater, at least 80 times greater, or at least 100 times greater. In another aspect, the vapor pressure of the second photocurable composition may be not greater than 150 times of the vapor pressure of the first photocurable composition, such as not greater than 130 times, not greater than 100 times, not greater than 90 times, or not greater than 70 times, or not greater than 60 times.

In one aspect, the higher vapor pressure of the second photocurable composition in comparison to the first photocurable composition can be achieved by adjusting the type and amount of the monomers of the second polymerizable material.

In one aspect, the monomers or oligomers of the second polymerizable material can have a vapor pressure of at least 0.01 mmHg, or at least 0.03 mmHg, or at least 0.05 mmHg, or at least 0.06 mmHg, or at least 0.08 mmHg, or at least 0.1 mmHg, or at least 0.2 mmHg, or at least 0.25 mmHg, or at least 0.3 mmHg, or at least 0.35 mmHg. In a certain particular aspect, the total vapor pressure of the second photocurable composition can be at least 0.1 mmHg.

In another certain aspect, the second photocurable composition can comprise a monofunctional acrylate monomer and a multi-functional acrylate monomer, wherein a weight % ratio between the monofunctional acrylate and the multifunctional acrylate monomer can be between 1:5 and 5:1. In certain particular aspects, the ratio between of the monofunctional acrylate and the multifunctional acrylate monomer can be at least 1:1, or at least 1.5:1, or at least 2:1, or at least 2.3:1.

As used herein, unless indicated otherwise, the term "acrylate monomer" addresses monomers containing an alkyl substitution, for example, methacrylate, or monomers wherein the acrylate groups do not contain any substitutions.

In another aspect, at least 95 wt %, or at least 98 wt %, or all of the monomers of the polymerizable material can fall within the above-cited vapor pressures.

Non-limiting examples of monofunctional monomers suitable for use in the second polymerizable material and having the above-described desired vapor pressure can be cyclohexyl acrylate, tert-butyl acrylate, 2-methoxyethyl acrylate, n-hexyl acrylate, 3-ethyl-3-oxatanylmethyl acrylate, tetrahydrofurfuryl acrylate, octyl acrylate, trimethyl cyclohexyl acrylate, nonyl acrylate, benzyl acrylate, isobornyl acrylate, ethoxy ethoxy ethyl acrylate, tertiobutyl cyclohexanol acrylate, cyclic trimethylolpropane formal acrylate, (2-ethyl-2-methyl-1,3-dioxolate-4-yl)-methyl acrylate, etc.; non-limiting examples of multifunctional monomers (crosslinkers) suitable for use in the second polymerizable material and having the above-described desired vapor pressure can be ethylene glycol diacrylate, 1,3-butylene glycol diacrylate, neopentyl glycol diacrylate, 1,4-butanediol diacrylate, 3-methyl-1,5-pentanediol diacrylate, diethylene glycol diacrylate, dipropylene glycol diacrylate, or 1,6-hexanediol diacrylate.

In another embodiment, the first photocurable composition can be essentially free of a solvent and the second photocurable composition may comprise a solvent.

As used herein, if not indicated otherwise, the term solvent relates to a compound which can dissolve or disperse the polymerizable monomers but does not itself polymerize during the photo-curing of the photocurable composition. The term "essentially free of a solvent" means herein an amount of solvent being not greater than 5 wt % based on the total weight of the photocurable composition. In a certain particular aspect, the amount of a solvent can be not greater than 3 wt %, not greater than 2 wt %, not greater than 1 wt %, or the photocurable composition can be free of a solvent, except for unavoidable impurities.

In a particular aspect, an amount of the solvent contained in the second photocurable composition can be at least 6 wt % based on the total weight of the photocurable composition, such as at least 8 wt %, at least 10 wt %, at least 15 wt %, at least 20 wt %, at least 30 wt %, at least 50 wt %, or at least 70 wt %. In another aspect the amount of solvent contained in the second photocurable composition may be not greater than 90 wt %, or not greater than 80 wt %, or not greater than 60 wt %, or note greater than 40 wt %, or not greater than 30 wt %, or not greater than 20 wt %, or not greater than 15 wt %.

In another aspect, both the first photocurable composition and the second photocurable composition can comprise a solvent.

The solvent of the second photocurable composition can be selected that it has a vapor pressure as described above for the monomers of the polymerizable material of the second photocurable composition.

In a particular embodiment, the first photocurable composition and the second photocurable composition can both have a low viscosity to facilitate forming of a thin and homogeneous film on the substrate. In one aspect, the viscosity of the first and second photocurable compositions can be not greater than 100 mPa·s, such as not greater than 50 mPa·s, or not greater than 30 mPa·s, or not greater than 20 mPa·s, or not greater than 15 mPa·s, or not greater than 12 mPa·s, or not greater than 10 mPa·s. In another aspect, the viscosity of the first and second photocurable compositions can be at least 1 mPa·s, or at least 3 mPa·s, or at least 5 mPa·s. As used herein, all viscosities are measured at 23° C. with a Brookfield viscometer.

In a particular aspect, the difference of the viscosity of the first photocurable composition to the viscosity of the second photocurable composition may be not greater than 20 mPa·s, such as not greater than 15 mPa·s, or not greater than 10 mPa·s, or not greater than 5 mPa·s.

The present disclosure is further directed to a method of forming an article. The method can comprise forming a photo-cured layer on a substrate as described above. The substrate and the photo-cured layer may be subjected to additional processing to form the desired article, for example, by including an etching process to transfer an image into the substrate that corresponds to the pattern in one or both of the solidified layers and/or patterned layers that are underneath the solidified layer. The substrate can be further subjected to known steps and processes for device (article) fabrication, including, for example, curing, oxidation, layer formation, deposition, doping, planarization, etching, formable material removal, dicing, bonding, and packaging, and the like. In a certain aspect, the substrate may be processed to produce a plurality of articles.

The photo-cured layer may be further used as an interlayer insulating film of a semiconductor device, such as LSI, system LSI, DRAM, SDRAM, RDRAM, or D-RDRAM, or as a resist film used in a semiconductor manufacturing process.

EXAMPLES

The following non-limiting examples illustrate the concepts as described herein.

Example 1

On a silicon wafer having a rectangular shape and a total surface area of 858 mm$^2$ is deposited a first resist within the central region of the wafer using a first depositor. Concurrently, a second resist is dispersed on the silicon wafer with a second depositor within the edge region of the wafer, wherein the edge region is reaching 0.5 mm from the outermost edge of the wafer in orthogonal direction towards the center of the wafer. An illustration of the wafer substrate (21) divided in center region (22) and edge region (23) is shown in FIG. 2B.

After depositing the first and second resist, a superstrate is brought in contact with the first and second resist to fully spread and cover the wafer surface with the dispersed first and second resist, such that a thickness between outer surface of the wafer and contact surface of the superstrate is about 300 microns. Thereafter, the first and second resist are photo-cured with UV light passing through the UV-transparent superstrate. Following the UV curing, the superstrate is removed, and the quality of the formed photo-cured layer is analyzed.

A summary of the photocurable compositions of the first resist and the second resist is shown in Table 1.

TABLE 1

| | Amount [parts] | First Resist | Second Resist |
|---|---|---|---|
| Crosslinking monomer | 30 | 1,9-Nonanediol diacrylate (V.P. ≈ 0.0014 mmHg) | Ethylene glycol diacrylate (V.P. ≈ 0.066 mmHg) |
| Monomer | 70 | Dicyclopentyl acrylate (V.P. ≈ 0.0077 mmHg) | Cyclohexyl acrylate (V.P. ≈ 0.39 mmHg) |
| Photoinitiator | 3 | Omnirad 819 | Omnirad 1173 |
| Surfactant | 3 | FS2000M2 | none |
| Estimated resist vapor pressure [mmHg] | | 0.0061 | 0.29 |

It can be seen from Table 1 that the second resist had an about 50 times greater vapor pressure than the first resist. Using this combination of first resist and second resist is leading to a photo-cured resist layer having no extrusion within the edge region after curing.

In contrast, if only the first resist is applied throughout the wafer surface (covering central region and edge region), without using the second resist, the formation of an extrusion having a maximum height of at least 100 nm is observed after photo-curing.

Example 2

Table 2 summarizes a variety of phoptocurable resist compositions (R1 to R9) with different estimated vapor pressures. From table 2, a combination of two resist compositions can be selected by using for the center region a first resist having a lower vapor pressure than the second resist selected for the edge region. Particularly suitable are combinations wherein the second resist is selected from samples R1-R5, which all have a vapor pressure higher than 0.01 mmHg, while the first resist composition is selected from resist samples R6-R9, which all have a vapor pressure below 0.01 mmHg.

Any of such combinations may avoid the forming of an extrusion within the edge region having a height greater than 60 nm.

The total vapor pressure of the resist compositions listed in Table 2 have been calculated with the following formula:

$$\frac{\sum \frac{x_i VP_i}{MW_i}}{\sum \frac{x_i}{MW_i}},$$

wherein x is the mass fraction, VP is the vapor pressure, and MW is the molecular weight of each component (i).

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:
1. A method of forming a photo-cured layer on a substrate, comprising:
applying a first photocurable composition directly overlying a first region of the substrate and a second photocurable composition directly overlying a second region of the substrate, wherein the first region is located at a center region of the substrate and the second region is located at an edge region of the substrate and the first region;

TABLE 2

| Monomer | Vapor Press. [mmHg] | R1 | R2 | R3 | R4 | R5 | R6 | R7 | R8 | R9 |
|---|---|---|---|---|---|---|---|---|---|---|
| Cyclohexyl acrylate | 0.393 | 70 | 35 | | | | | | | |
| Benzyl acrylate | 0.0583 | | | 70 | | | | | | |
| Isobornyl acrylate | 0.032 | | 35 | | 70 | 25 | | | | |
| Dicyclopentyl acrylate | 7.73E–03 | | | | | | 70 | 30 | | |
| 2-Phenyloxyethyl ethanol acrylate | 1.81E–03 | | | | | | | | 60 | |
| Dicyclopentenyloxyethyl acrylate | 6.69E–05 | | | | | | | | | 70 |
| Ethylene glycol diacrylate | 0.0658 | 30 | | | | | | | | |
| Neopentyl glycol diacrylate | 0.0353 | | 30 | | | | | | | |
| 3-Methyl-1,5-pentanediol diacrylate | 0.0291 | | | 30 | | | | | | |
| 1,6-Hexanediol Diacrylate | 0.0166 | | | | 30 | | | | | |
| Diethylene glycol diacrylate | 6.06E–03 | | | | | 75 | | | | 30 |
| 1,9-Nonanediol diacrylate | 0.00141 | | | | | | 30 | 70 | | |
| 1,10-Decanediol diacrylate | 6.71E–04 | | | | | | | | 20 | |
| Tricyclodecane dimethanol diacrylate | 1.88E–06 | | | | | | | | 20 | |
| Pluronic L44 | ~0 | | | | | | 3 | 3 | 3 | 3 |
| Omnirad 1173 | 6.33E–03 | 3 | 3 | 3 | 3 | 3 | | | | |
| Omnirad 819 | 2.06E–08 | | | | | | 3 | 3 | 3 | 3 |
| Estimated resist vapor pressure [mmHg] | | 0.293 | 0.18 | 0.050 | 0.027 | 0.012 | 6.1E–03 | 3.6E–03 | 1.3E–03 | 4.4E–04 | contacting the first photocurable composition and the second photocurable composition with a template or superstrate;

photo-curing the first photocurable composition and the second photocurable composition to form the photo-cured layer; and removing the template or superstrate, wherein the second photocurable composition has a higher vapor pressure than the first photocurable composition at room temperature.

2. The method of claim 1, wherein the first photocurable composition is essentially free of a solvent and the second photocurable composition is essentially free of a solvent.

3. The method of claim 1, wherein a maximum height of an extrusion of the photo-cured layer within the second region is not greater than a maximum feature height of a pattern within the first region.

4. The method of claim 1, wherein a maximum height of an extrusion of the photo-cured layer within the second region is not greater than 60 nm.

5. The method of claim 1, the method further comprising etching the photo-cured layer, wherein a first etch rate of the photo-cured layer within the first region differs not more by 10% from a second etch rate of the photo-cured layer within the second region.

6. The method of claim 1, wherein the method is adapted for nanoimprint lithography or inkjet adaptive planarization, and the first photocurable composition is a first imprint resist and the second photocurable composition is a second imprint resist.

7. The method of claim 1, wherein the first photocurable composition and the second photocurable composition are merging and intermixing at an interface region; the interface region being located between the first region and the second region; and an area of the interface region is not greater than 20% an area of the edge region.

8. The method of claim 1, wherein the vapor pressure of the second photocurable composition is at least two times greater than the vapor pressure of the first photocurable composition at room temperature.

9. The method of claim 8, wherein the vapor pressure of the second photocurable composition is at least 0.01 mm Hg at room temperature.

10. The method of claim 1, wherein an area ratio of the first region of the substrate to the second region of the substrate is at least 10:1.

11. The method of claim 10, wherein an area ratio of the first region of the substrate to the second region of the substrate is at least 25:1.

12. The method of claim 1, wherein the first photocurable composition is applied with a first dispenser on the substrate and the second photocurable composition is applied with a second dispenser on the substrate.

13. The method of claim 12, wherein the first photocurable composition is applied during a same time period as the second photocurable composition on the substrate.

14. The method of claim 1, wherein the first photocurable composition comprises a first polymerizable material and a first photoinitiator, and the second photocurable composition comprises a second polymerizable material and a second photoinitiator.

15. The method of claim 14, wherein the first polymerizable material comprises at least one different monomer than the second polymerizable material.

16. The method of claim 14, wherein the first polymerizable material comprises at least one first acrylate monomer, and the second polymerizable material comprises at least one second acrylate monomer, the at least one first acrylate monomer being different than the at least one second acrylate monomer.

17. The method of claim 1, wherein the second region extends not more than 5 mm from the outer end of the substrate towards the center point of the substrate.

18. The method of claim 17, wherein the second region extends not more than 1 mm from the outer end of the substrate towards a center point of the substrate.

19. The method of claim 18, wherein the second region extends not more than 0.5 mm from the outer end of the substrate towards a center point of the substrate.

20. A method of forming an article, comprising applying a first photocurable composition directly overlying a first region of a substrate and a second photocurable composition directly overlying a second region of the substrate, wherein the first region is a center region of the substrate and the second region is an edge region of the substrate, and the second photocurable composition has a higher vapor pressure than the first photocurable composition at room temperature;

contacting the first photocurable composition and the second photocurable composition with a template or superstrate;

photo-curing the first photocurable composition and the second photocurable composition to obtain a photo-cured layer;

removing the template or superstrate from the photo-cured layer, and processing the substrate with the photo-cured layer to make the article.

21. The method of claim 20, wherein an area ratio of the first region to the second region is at least 10:1, and the second photocurable composition has a two times greater vapor pressure at room temperature than the first photocurable composition.

* * * * *